United States Patent
Chen et al.

(10) Patent No.: US 9,647,452 B2
(45) Date of Patent: May 9, 2017

(54) ELECTROSTATIC DISCHARGE PROTECTION FOR LEVEL-SHIFTER CIRCUIT

(71) Applicant: Taiwan Semiconductor Manufacturing Company, Ltd., Hsin-Chu (JP)

(72) Inventors: Chia-Hui Chen, Hsin-Chu (TW); Chia-Hung Chu, Hsin-Chu (TW); Kuo-Ji Chen, Wu-Ku (TW); Ming-Hsiang Song, Hsin-Chu (TW); Lee-Chung Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/273,187

(22) Filed: Sep. 22, 2016

(65) Prior Publication Data

US 2017/0012038 A1    Jan. 12, 2017

Related U.S. Application Data

(62) Division of application No. 14/031,826, filed on Sep. 19, 2013, now Pat. No. 9,466,978.

(60) Provisional application No. 61/872,519, filed on Aug. 30, 2013.

(51) Int. Cl.
| | |
|---|---|
| *H02H 9/04* | (2006.01) |
| *H01L 27/02* | (2006.01) |
| *H03K 19/0175* | (2006.01) |
| *H03K 19/003* | (2006.01) |

(52) U.S. Cl.
CPC ......... *H02H 9/046* (2013.01); *H01L 27/0285* (2013.01); *H03K 19/003* (2013.01); *H03K 19/017509* (2013.01)

(58) Field of Classification Search
CPC ............. H01L 27/0248; H01L 27/0266; H01L 27/0285; H02H 9/04; H02H 9/046; H03K 3/013; H03K 5/003; H03K 19/003; H03K 19/017509; H03K 19/018507–19/018528
See application file for complete search history.

(56) References Cited

U.S. PATENT DOCUMENTS

| | | | |
|---|---|---|---|
| 5,946,177 A | 8/1999 | Miller et al. | |
| 6,459,300 B1 * | 10/2002 | Terletzki | H03K 19/09429 326/68 |
| 7,403,361 B2 * | 7/2008 | Tanaka | H03K 3/356104 257/357 |
| 7,697,249 B2 * | 4/2010 | Im | H05K 9/0067 361/111 |

(Continued)

*Primary Examiner* — Stephen W Jackson
*Assistant Examiner* — Christopher Clark
(74) *Attorney, Agent, or Firm* — Slater Matsil, LLP

(57) ABSTRACT

In some embodiments, a method includes providing an input voltage to a level-shifting circuit, where the input voltage is in a first power domain, shifting the input voltage to an output voltage using the level-shifting circuit, where the output voltage is in a second power domain different from the first power domain, and where the level-shifting circuit is coupled to power supply voltages in the second power domain. The method further includes in response to an electrostatic discharge (ESD) event, turning off a first transistor coupled between a first node of the level-shifting circuit and a reference low voltage level of the second power domain.

20 Claims, 5 Drawing Sheets

(56) References Cited

U.S. PATENT DOCUMENTS

| | | | |
|---|---|---|---|
| 7,800,426 B2* | 9/2010 | Chang | H03K 3/012 326/80 |
| 7,812,674 B2* | 10/2010 | Karp | G06F 17/5063 330/298 |
| 8,018,266 B2* | 9/2011 | Chan | H03K 19/018521 326/62 |
| 8,564,918 B2* | 10/2013 | Gagne | H03K 17/063 361/86 |
| 8,766,696 B2* | 7/2014 | Gazit | H03K 19/018521 326/80 |
| 2003/0156371 A1* | 8/2003 | S. Ajit | H03K 17/08122 361/86 |
| 2006/0092587 A1* | 5/2006 | Czech | H01L 27/0251 361/56 |
| 2006/0114629 A1* | 6/2006 | Wu | H01L 27/0266 361/56 |
| 2009/0138279 A1 | 5/2009 | Avinash et al. | |
| 2009/0168279 A1* | 7/2009 | Kuo | H03K 17/08142 361/56 |
| 2009/0237139 A1* | 9/2009 | Kang | H03K 3/35613 327/333 |
| 2010/0008001 A1* | 1/2010 | Do | H01L 27/0251 361/56 |
| 2010/0109743 A1* | 5/2010 | Czech | H03K 17/102 327/333 |
| 2012/0154009 A1* | 6/2012 | Ho | H03K 3/356191 327/215 |
| 2013/0106474 A1* | 5/2013 | Kossel | H01L 27/0266 327/142 |
| 2014/0078624 A1* | 3/2014 | Nagamatsu | H01L 27/0285 361/18 |
| 2014/0266386 A1* | 9/2014 | Huang | H03K 3/35613 327/333 |
| 2014/0268441 A1* | 9/2014 | Mallikarjunaswamy | H03K 17/08104 361/56 |

* cited by examiner

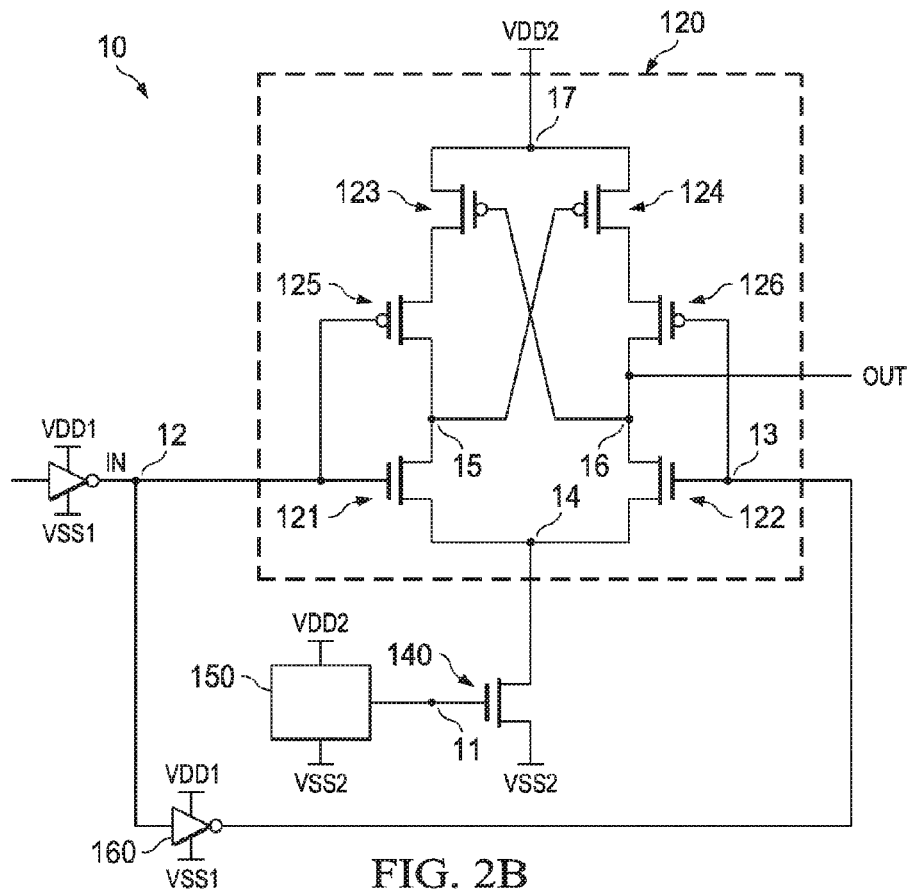
FIG. 2B
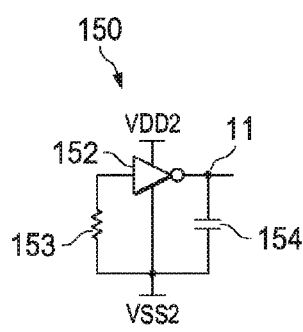
FIG. 3A
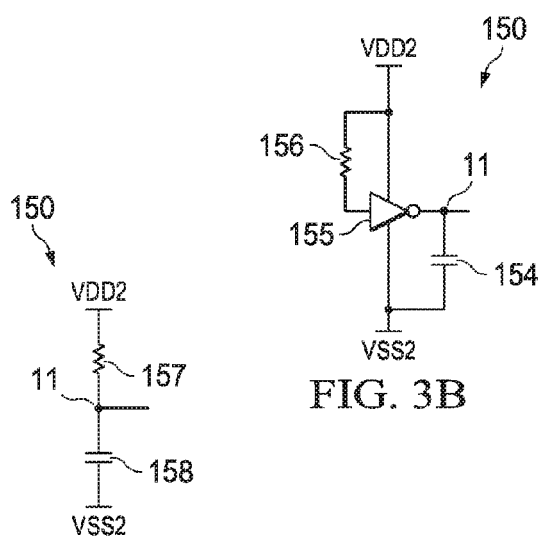
FIG. 3B
FIG. 3C

US 9,647,452 B2

ELECTROSTATIC DISCHARGE PROTECTION FOR LEVEL-SHIFTER CIRCUIT

PRIORITY CLAIM

This application is a divisional of U.S. patent application Ser. No. 14/031,826, filed on Sep. 19, 2013, entitled "Electrostatic Discharge Protection for Level-Shifter Circuit," which claims the benefit of U.S. Provisional Application No. 61/872,519, filed Aug. 30, 2013, entitled "Electrostatic Discharge Protection for Level-Shifter Circuit," which applications are hereby incorporated herein by reference.

BACKGROUND

The trend in VLSI technology has resulted in narrower interconnection lines and smaller contacts. Furthermore, integrated circuit designs are becoming more complex and denser. More devices are compressed in integrated circuits to improve performance. As a result, integrated circuits become more susceptible and vulnerable to ESD (electrostatic discharge) events causing the circuits to fail.

Static electricity exists on the surfaces of many materials. When bodies of materials with different potential come into contact, ESD will occur. ESD is generally defined as a sudden and momentary electric current that flows between two objects at different electrical potentials. An ESD circuit provides an ESD current path for an ESD current associated with an ESD event. In this way, an ESD circuit mitigates ESD current from entering circuitry associated with a device. ESD can damage devices fabricated on IC chips causing performance degradation or failures.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A and 2B illustrate level-shifter circuits according to embodiments;

FIGS. 3A, 3B, and 3C illustrate control units according to embodiments;

DETAILED DESCRIPTION OF ILLUSTRATIVE EMBODIMENTS

Figure 1:
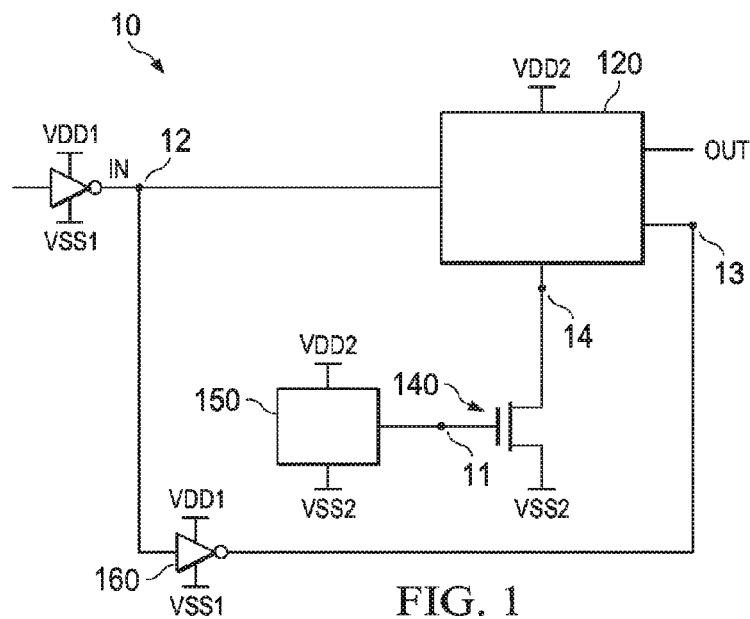
FIG. 1 illustrates a level-shifter circuit according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely electrostatic discharge (ESD) protection for circuits having different power domains. Other embodiments may also be applied, however, to other circuits needing ESD protection with a small layout footprint.

Embodiments discussed herein provide a level-shifter circuit having ESD protection with a minimal impact on layout area and performance of the circuit. The level-shifter circuit has a stacked receiver structure to increase the gate oxide breakdown voltage of the level-shifter receiver such that secondary ESD protection devices along the receiver paths are not necessary. The stacked receiver structure may be implemented by having a control circuit to "float" the source/drain of the receiver structure during an ESD event which increases the breakdown voltage of the receiver structure. The control circuit may be used with various circuit configurations of level-shifters to increase their breakdown. By having no secondary ESD protection, the layout area of the circuit is minimally impacted and the performance of the circuit is also minimally impacted.

FIG. 1 illustrates a circuit diagram of a level-shifter 10 according to an embodiment. The level-shifter 10 includes a level-shifting unit 120, a transistor 140, a control unit 150, and an inverter 160. Internal connectors of the level-shifter circuit are made at least at circuit nodes 11, 12, 13, and 14.

The level-shifter 10 shifts a signal from a first voltage range including a first upper supply voltage node VDD1 and a first lower supply voltage node VSS1 to a second voltage range including a second upper supply voltage node VDD2 and a second lower supply voltage node VSS2. In some embodiments, the first voltage range is from about 0 Volts to about 0.9 Volts, and the second voltage range is from about 0 Volts to about 1.8 Volts—a core-to-core level-shifter—and the operation voltage depends on the device safe operation area. In other embodiments, the first voltage range is from about 0 Volts to about 1.8 Volts, and the second voltage range is from about 0 Volts to about 5 Volts—a core-to-I/O level-shifter—and the operation voltage depends on the device safe operation area. In yet other embodiments, the first voltage range is from about 0 Volts to about 5 Volts, and the second voltage range is from about 0 Volts to about 1.8 Volts,—an I/O-to-core level-shifter—and the operation voltage depends on the device safe operation area.

The transistor 140, which is an N-type MOS (NMOS) transistor in some embodiments, is coupled to the level-shifting unit 120, the control unit 150 (node 11) and a second lower supply voltage node VSS2. A drain of the transistor 140 is coupled to the level-shifting unit 120 at node 14, a gate of the transistor 140 is coupled to the output of the control unit 150 at the node 11, and a source of the transistor 140 is coupled to the second lower supply voltage node VSS2. In some embodiments, the transistor 140 is a high threshold voltage (HVT) device to increase the ON threshold voltage. In some embodiments, the first upper supply voltage node VDD1 is lower than the second upper supply voltage node VDD2. In other embodiments, the first upper supply voltage node VDD1 is higher than the second upper supply voltage node VDD2.

The level-shifting unit 120 has a first input terminal coupled to the node 12 and a second input terminal coupled to the node 13. The level-shifting unit 120 is provided an input signal IN at the first upper supply voltage node VDD1 and provides an output signal OUT at the second upper supply voltage node VDD2. An input terminal of the inverter 160 is coupled to node 12, and an output terminal of the inverter 160 is coupled to the node 13. The inverter 160 outputs voltage that is the inverse of the voltage at node 12 to provide a complementary voltage at node 13 which is then provided to the level-shifting unit 120. The nodes 12 and 13 and the inverter 160 may also be referred to as an input circuit.

The control unit 150 turns on and off the transistor 140 to either pull down voltage at the node 14 or present high impedance to the node 14. The control unit 150 is coupled to the second upper supply voltage node VDD2 and the second lower supply voltage node VSS2. During normal operation, the control unit 150 outputs a high level voltage (VDD2) to node 11 which will turn on the transistor 140 to pull node 14 to VSS2. During an ESD event, the control unit 150 outputs a low level voltage (VSS2) at node 11 which will turn off the transistor 140 to present high impedance (floating) node 14. By "floating" node 14 during an ESD event, the transistor 140 provides ESD protection to the level-shifter 10 as discussed below.

Figure 2A:
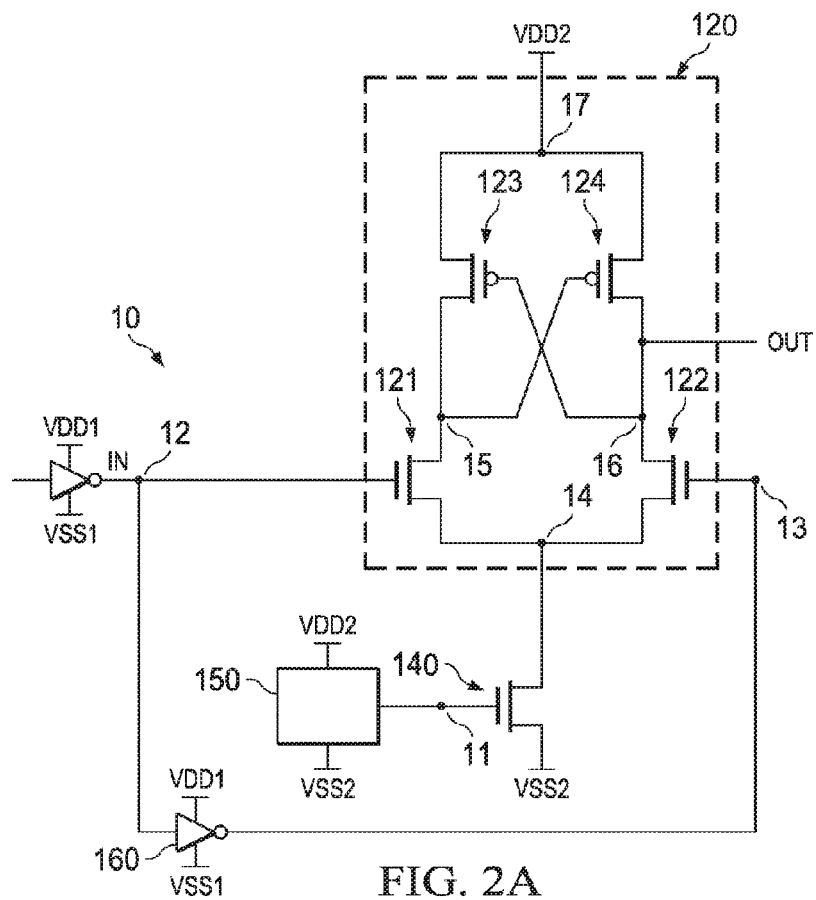

FIG. 2A illustrates a level-shifter 10 with a detailed circuit diagram of a level-shifting unit 120 according to an embodiment. The level-shifting unit 120 includes transistors 121, 122, 123, and 124. In an embodiment, the transistors 121 and 122 are NMOS transistors and the transistors 123 and 124 are PMOS transistors. The sources of transistors 121 and 122 are coupled to the drain of the transistor 140 at node 14, and the sources of the transistors 123 and 124 are coupled to VDD2 at node 17. The drain of the transistor 121 is coupled to the drain of the transistor 123, and the drain of the transistor 122 is coupled to the drain of the transistor 124. The gate of the transistor 123 is coupled at a node 16 to the drains of the transistors 122 and 124, and the gate of the transistor 124 is coupled at a node 15 to the drains of the transistors 121 and 123. That is the gate of the transistor 123 is coupled to the drain of the transistor 124, and the gate of the transistor 124 is coupled to the gate of the transistor 123 forming a cross-coupled pair of transistors 123 and 124. The input signal IN at node 12 is coupled to the gate of the transistor 121 and also to the inverter 160 which provides an inverted signal to the gate of the transistor 122.

The operation of the level-shifting unit 120 will be described during normal operation with the transistor 140 being turned on to couple node 14 to VSS2. During normal operation, when the input signal IN is in a low level (VSS1), the transistor 121 is turned off. At a same time, a high level signal (VDD1) is applied to the gate of the transistor 122 via the inverter 160 to turn on the transistor 122 so that the node 16 and the output signal OUT are at the voltage level of VSS2. The voltage level VSS2 at node 16 turns on transistor 123 so that node 15 has a voltage level of VDD2.

During normal operation, when the input signal is in a high level (VDD1), the transistor 121 is turned on so that the node 15 has a voltage level of VSS2. At a same time, a low level signal (VSS1) is applied to the gate of transistor 122 via the inverter 160 to turn off the transistor 122. The voltage level VSS2 at node 15 turns on transistor 124 so that node 16 and the output signal OUT are at the voltage VDD2. Thus, when the input signal IN is at VSS1, the output signal OUT is at VSS2, and when the input signal IN is at VDD1, the output signal OUT is at VDD2.

During an ESD event, the control unit 150 will apply a low level voltage (VSS2) to node 11 to turn off transistor 140 to present high impedance to node 14 from the drain of the transistor 140. When transistor 140 is off, the sources of the transistors 121 and 122 are floating (high impedance). By having the sources of the transistors 121 and 122 floating, the gate oxide breakdown voltage of the transistors 121 and 122 is increased as the gate to source terminal of the transistors are not directly stressed and thus the level-shifter 10 is more protected from an ESD event such as a positive cross-domain ESD event (e.g. from VDD1 to VSS2).

FIG. 2B illustrates a level-shifter 10 with a detailed circuit diagram of another level-shifting unit 120 according to another embodiment. The level-shifting unit 120 in FIG. 2B is similar to the level-shifting unit 120 in FIG. 2A except that it also includes transistors 125 and 126. The level-shifting unit 120 in FIG. 2B includes transistors 121, 122, 123, 124, 125, and 126. In an embodiment, the transistors 121 and 122 are NMOS transistors and the transistors 123, 124, 125, and 126 are PMOS transistors. The transistor 125 is coupled in series with transistor 121 and 123 with a drain of the transistor 125 coupled to the drain of transistor 121 at node 15 and a source of the transistor 125 coupled to the drain of transistor 123. The transistor 126 is coupled in series with transistor 122 and 124 with a drain of the transistor 126 coupled to the drain of transistor 122 at node 16 and a source of the transistor 126 coupled to the drain of transistor 124. By having the transistors 125 and 126 in the level-shifting unit 120, the transistors 121 and 122 are able to pull down nodes 15 and 16, respectively, to VSS2 more quickly. Although FIGS. 2A and 2B illustrate two specific embodiments of a level-shifting unit 120, the level-shifting unit 120 is not limited to these embodiments as any suitable level-shifting unit 120 is within the contemplated scope of the present disclosure.

FIGS. 3A, 3B, and 3C illustrate detailed circuit diagrams of a control unit 150 according to various embodiments. FIG. 3A illustrates an embodiment of a control unit 150 including an inverter 152, a resistor 153, and an optional capacitor 154. The resistor 153 is coupled between the second lower supply voltage node VSS2 and an input terminal of the inverter 152. The output of the inverter 152 is coupled to node 11 to output a voltage at node 11 to either turn on or turn off the transistor 140 (see FIG. 1). The capacitor 154 is coupled between the output of the inverter 152 (node 11) and the second lower supply voltage node VSS2 to act as a tracking capacitor and will be referred to as a tracking capacitor 154 hereinafter.

During normal operation, the inverter 152 outputs a high level voltage at node 11 to turn on the transistor 140. During an ESD event, the inverter 152 outputs a low level voltage at node 11 which will turn off the transistor 140. During some ESD events, the voltage VDD2 could be coupled high enough to make the inverter 152 output a high voltage at node 11 and turn on transistor 140. In these embodiments, the tracking capacitor 154 acts as a tracking capacitor to ensure that the node 11 is at a low level to turn off transistor 140 which, as discussed above, increases the ESD protection of the level-shifting unit 120. In some embodiments, the tracking capacitor 154 is omitted.

FIG. 3B illustrates an embodiment of a control unit 150 including a buffer 155, a resistor 156, and the optional tracking capacitor 154. The resistor 156 is coupled between the second upper supply voltage node VDD2 and an input terminal of the buffer 155. The output of the buffer 155 is coupled to node 11 to output a voltage at node 11 to either turn on or turn off the transistor 140 (see FIG. 1). The tracking capacitor 154 is coupled between the output of the inverter 152 (node 11) and the second lower supply voltage node VSS2. The details of this embodiment similar to the previous embodiment are not repeated herein.

During normal operation, the buffer 155 outputs a high level voltage at node 11 to turn on the transistor 140. During an ESD event, the buffer 155 outputs a low level voltage at node 11 which will turn off the transistor 140. During some ESD events, the voltage VDD2 could be coupled high enough to make the buffer 155 output a high voltage at node 11 and turn on transistor 140. In these embodiments, the tracking capacitor 154 acts as a tracking capacitor to ensure that the node 11 is at a low level to turn off transistor 140 which, as discussed above, increases the ESD protection of the level-shifting unit 120. In some embodiments, the tracking capacitor 154 is omitted.

FIG. 3C illustrates an embodiment of a control unit 150 including a resistor 157 and a capacitor 158. The resistor 157 and the capacitor 158 are coupled in series between the second upper supply voltage node VDD2 and the second ground voltage with node 11 being between the resistor 157 and the capacitor 158.

During normal operation, the second upper supply voltage node VDD2 charges the capacitor 158 to output a high level voltage at node 11 to turn on the transistor 140. During an ESD event, the capacitor 158 and the resistor 157 acts as a resistor-capacitor (RC) delay circuit to output a low level voltage at node 11 which will turn off the transistor 140 which, as discussed above, increases the ESD protection of the level-shifting unit 120.

The embodiments in FIGS. 3A, 3B, and 3C are only examples of the control unit 150 and other embodiments including various other active and passive devices are within the contemplated scope of the present disclosure. For example, the control unit 150 may include other types of devices such as NAND gates, NOR gates, or any other suitable devices to output a voltage at node 11 turn on the transistor 140 during normal operation and turn off the transistor 140 during an ESD event.

Figure 4:
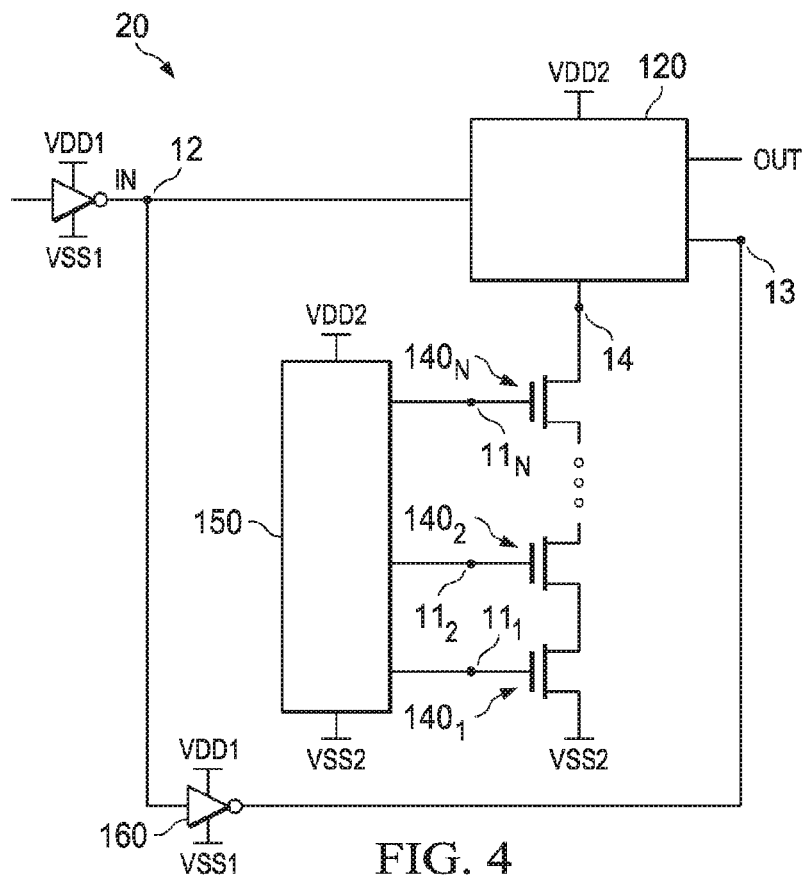
FIG. 4 illustrates another level-shifter circuit according to another embodiment.

FIG. 4 illustrates a level-shifter 20 according to another embodiment wherein the level-shifter 20 includes more than one transistor 140. This embodiment is similar to the embodiment described above in FIG. 1 except that this embodiment includes more than one transistor 140 ($140_1$, $140_2$, and $140_N$) connected in series between node 14 and the second lower supply voltage node VSS2. In some embodiments, the transistors 140 are NMOS transistors. By having more than one transistor 140 in series, the gate oxide breakdown voltage of the receiver structure of the level-shifting unit 120 may be further increased. The details of this embodiment similar to the previous embodiment are not repeated herein.

In this embodiment, a first transistor $140_1$ has a source coupled to the second lower supply voltage node VSS2 and a gate coupled to the control unit 150 at a first node $11_1$. A second transistor $140_2$ has a source coupled to a drain of the first transistor $140_1$ and a gate coupled to the control unit 150 at a second node $11_2$. In some embodiments, there may be N number of transistors 140 where N>=2 with each additional transistor 140 (e.g. transistor $140_N$) having its source coupled to the previous transistor 140 (e.g. transistor $140_{N-1}$) and its gate coupled to a corresponding node 11 (e.g. node $11_N$).

Figure 5:
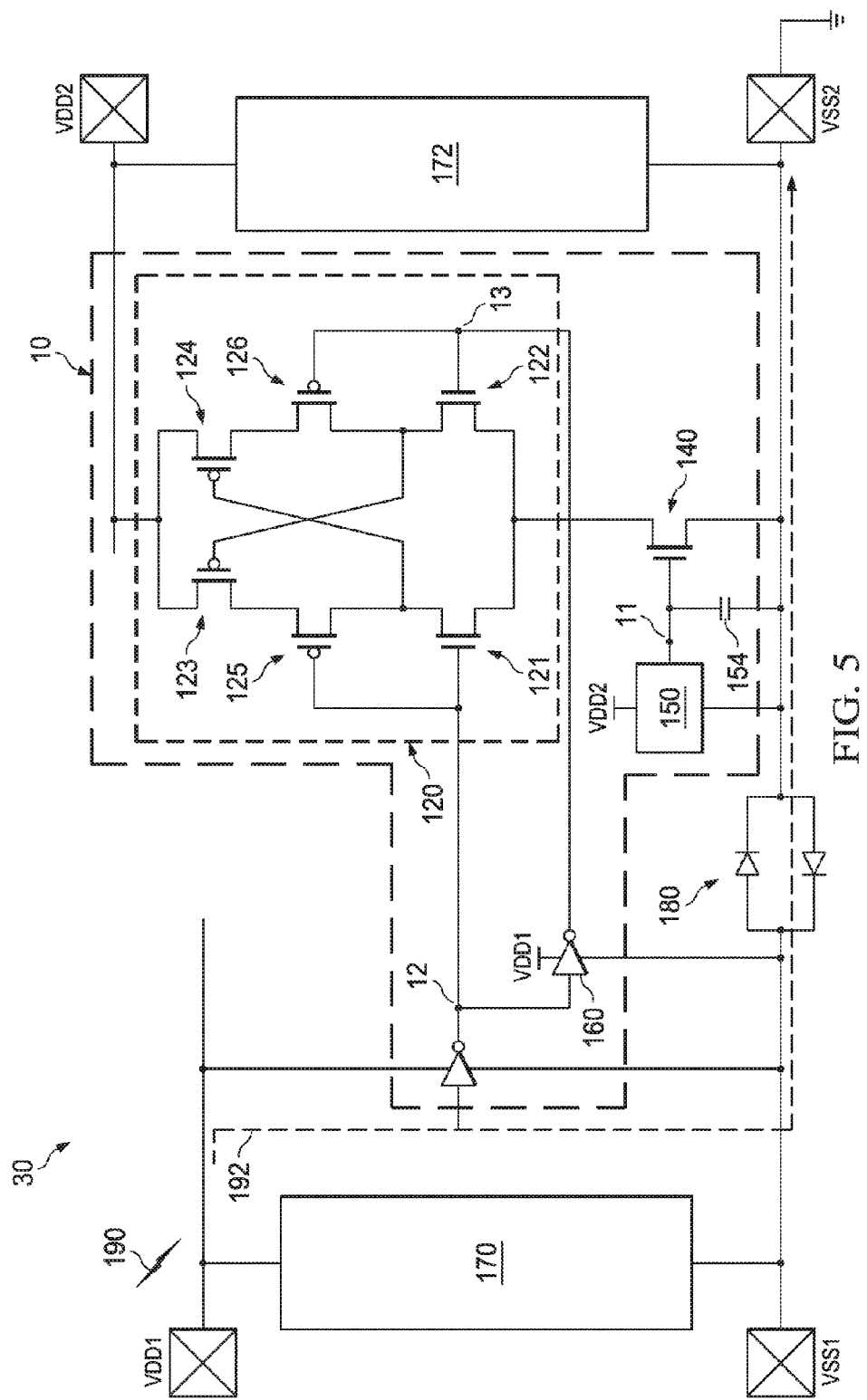
FIG. 5 illustrates a cross-domain interface circuit including a level-shifter circuit according to an embodiment.

FIG. 5 illustrates a circuit diagram of a cross-domain interface 30 including a level-shifter 10 according to an embodiment. The level-shifter 10 illustrated in FIG. 5 is similar to the level-shifter 10 illustrated in FIG. 2B described above and the description is not repeated herein. The cross-domain interface 30 also includes an isolation unit 180 to isolate the first and second lower supply voltages VSS1 and VSS2 from each other. In an embodiment, the isolation unit 180 includes parallel diodes configured in opposite directions to prevent the first and second lower supply voltages VSS1 and VSS2 from being coupled together while also allowing a cross-domain ESD event to discharge across the isolation unit 180.

The cross-domain interface 30 further includes a first ESD power clamp 170 coupled between the first upper supply voltage node VDD1 and the first lower supply voltage node VSS1 and a second ESD power clamp coupled between the second upper supply voltage node VDD2 and the second lower supply voltage node VSS2. The first and second ESD power clamps 170 and 172 are configured to provide ESD protection in the first power domain (VDD1 and VSS1) and the second power domain (VDD2 and VSS2), respectively. However, neither the first or second ESD power clamps 170 or 172 provide ESD protection from a cross-domain ESD event such as a cross-domain ESD event from the first upper supply voltage node VDD1 to the second lower supply voltage node VSS2. There may be any number of ESD power clamps 170 or 172 can be included and coupled between VDD1, VDD2, VSS1, and/or VSS2. In some embodiments, the ESD power clamps 170 and 172 include transistors (not shown) to discharge an ESD event from VDD1 to VSS1 and VDD2 to VSS2, respectively. In other embodiments, the ESD power clamps 170 and 172 include a series of bipolar transistors (not shown). In some embodiments, the ESD power clamps 170 and 172 include detection circuits (not shown) to enable the ESD power clamps during ESD events.

In an embodiment, a cross-domain ESD event 190 occurs which is a positive cross-domain ESD event from the first upper supply voltage node VDD1 to the second lower supply voltage node VSS2. The control unit 150 detects the cross-domain ESD event 190 and sets node 11 to a low voltage level to turn off the transistor 140 which floats the sources of the transistors 121 and 122 of the level-shifting unit 120. As discussed above, the floating of the sources of the transistors 121 and 122 increases the gate oxide breakdown voltage of the transistors 121 and 122 and allows the cross-domain ESD event 190 to be discharged along an ESD discharge path 192 to VSS2 without damaging the level-shifting unit 120.

Figure 6:
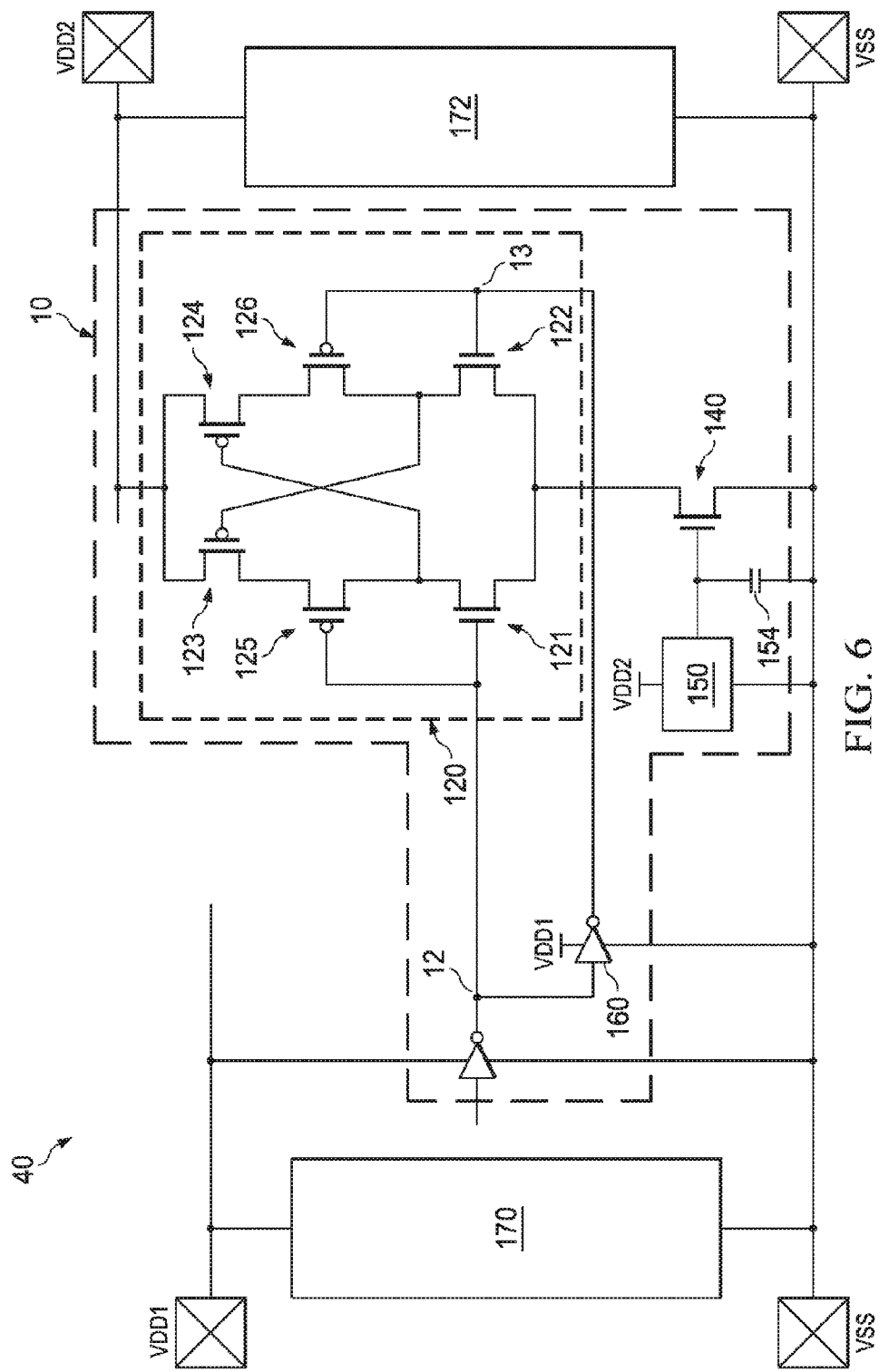
FIG. 6 illustrates another cross-domain interface circuit including a level-shifter circuit according to another embodiment.

FIG. 6 illustrates a circuit diagram of a cross-domain interface 40 including a level-shifter 10 according to an embodiment. The cross-domain interface 40 is similar to the cross-domain interface 30 described above except that cross-domain interface 40 includes the first and second voltage levels VDD1 and VDD2 and only one ground voltage VSS which is common to both the first and second voltage levels VDD1 and VDD2. The level-shifter 10 with the same configuration as cross-domain interface 30 provides ESD protection for cross-domain interface 40 with two different power domains (e.g. VDD1 and VDD2) and a common ground (e.g. VSS).

Figure 7:
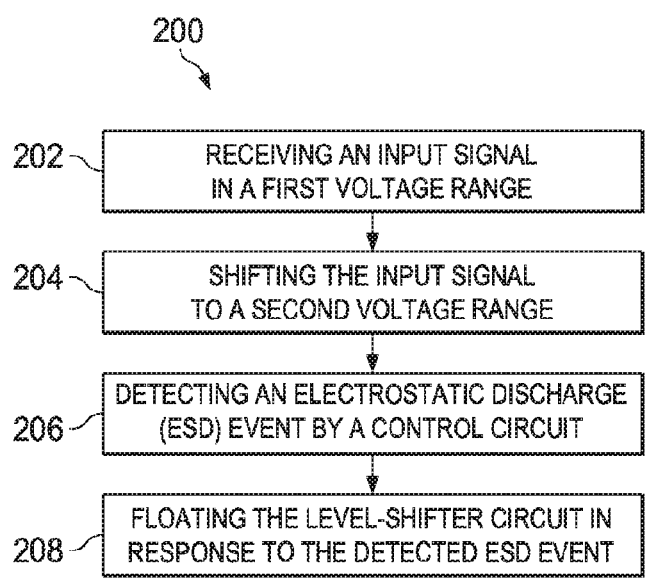
FIG. 7 illustrates a process flow diagram of operating a level-shifter circuit according to an embodiment.

FIG. 7 is a flow diagram illustrating a method 200 of operating a level-shifter circuit according to an embodiment. An input signal at a first voltage range is received in block 202. The input signal is shifted to a second voltage range in block 204. A control circuit detects an electrostatic discharge (ESD) event in block 206. The control circuit floats the level-shifter circuit in response to the detected ESD event in block 208.

Circuits are typically powered and/or biased by multiple voltages. The multiple voltages set up potential differences that allow electrical currents to flow throughout the circuit to perform various functions. Typically, electrical currents are defined as flowing from high voltage to low voltage. Voltage sources in circuits are also often defined in terms of a supply voltage and ground, with ground representing 0 Volts. Other definitions are sometimes given in terms of an upper supply voltage (VDD, VCC), and a lower supply voltage (VSS, VEE). Thus, a circuit that operates on a 1.8 Volt supply may be defined as having an upper bias of 0.9 Volts, and a lower bias of −0.9 Volts. In the following description, the term "ground" should be interpreted as including low supply voltage, such as the −0.9 Volts in the previous example, unless specifically referred to as "earth ground," or the like. Voltage levels, being relative, are not then intended so much to limit the scope of the disclosure, but more as a point of reference for convenient illustration.

Metal-oxide-semiconductor (MOS) transistors are typically described in terms of four transistor terminals: a gate, a source, a drain, and a bulk. It should be appreciated that most MOS transistors are symmetrical devices, such that the source and the drain thereof are interchangeable, and the terms "source" and "drain" often represent nomenclature for convenience of discussion. Terminals of MOS transistors may also be referred to as "electrodes," "ends," and the like, without any distinction intended through use of these different names. Biasing of such terminals is usually performed through direct or indirect contact between a direct current (DC) voltage source and the terminal being biased. The contact may be through metallization layers, contact vias, pads, bumps, and/or similar interconnect structures formed on and over device regions of the MOS transistors.

An embodiment is a circuit including an input circuit having a first output and a second output, the input circuit being coupled to a first power supply voltage, and a level-shifting circuit having a first input coupled to the first output of the input circuit and a second input coupled to the second output of the input circuit, the level-shifting circuit being coupled to a second power supply voltage. The circuit further includes a first transistor coupled between a first node of the level-shifting circuit and the second power supply voltage, and a control circuit having an output coupled to a gate of the first transistor, the control circuit being coupled to the second power supply voltage.

Another embodiment is a multiple power domain circuit including an input circuit in a first power domain, and a level-shifting unit coupled to an output terminal of the input circuit, the level-shifting unit being in a second power domain, the second power domain being different than the first power domain. The multiple power domain circuit further includes a first transistor coupled between a first node of the level-shifting unit and a ground node of the second power domain, and a control unit configured to generate a control signal to a gate of the first transistor, the control unit being in the second power domain.

A further embodiments is a method including receiving an input signal in a first voltage range, and shifting the input signal to a second voltage range by a level-shifter circuit, the second voltage range being different than the first voltage range. The method further includes detecting an electrostatic discharge (ESD) event by a control circuit, and floating the level-shifter circuit in response to the detected ESD event by turning off a first transistor.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing an input voltage to a level-shifting circuit, wherein the input voltage is in a first power domain;
   shifting the input voltage to an output voltage using the level-shifting circuit, wherein the output voltage is in a second power domain different from the first power domain, wherein the level-shifting circuit is coupled to power supply voltages in the second power domain; and
   in response to an electrostatic discharge (ESD) event, turning off a first transistor coupled between a first node of the level-shifting circuit and a reference low voltage level of the second power domain.

2. The method of claim 1, wherein the first transistor is an N-type transistor, wherein the turning off comprises supplying a reference low voltage level of the second power domain to a gate of the first transistor.

3. The method of claim 2, further comprising detecting the ESD event using a control circuit.

4. The method of claim 3, wherein the control circuit is coupled to the power supply voltages of the second power domain, wherein an output of the control circuit is coupled to the gate of the first transistor, and wherein the control circuit outputs a reference low voltage level of the second power domain during an ESD event.

5. The method of claim 4, wherein the control circuit comprises:
   an inverter, wherein an output of the inverter is coupled to the output of the control circuit;
   a capacitor coupled between the output of the inverter and the reference low voltage level of the second power domain; and
   a resistor coupled between an input of the inverter and a first one of the reference low voltage level and a reference high voltage level of the second power domain.

6. The method of claim 4, wherein the control circuit comprises:
   a resistor coupled between a reference high voltage level of the second power domain and the output of the control circuit; and a capacitor coupled between the reference low voltage level of the second power domain and the output of the control circuit.

7. The method of claim 4, wherein the providing the input voltage to the level-shifting circuit comprises:
providing the input voltage to a first input of the level-shifting circuit;
inverting the input voltage, thereby forming an inverted input voltage; and
providing the inverted input voltage to a second input of the level-shifting circuit.

8. The method of claim 4, wherein the level-shifting circuit comprises:
a second transistor having:
a gate coupled to a first input of the level-shifting circuit;
a source coupled to the first node of the level-shifting circuit; and
a drain coupled to a second node of the level-shifting circuit;
a third transistor having:
a gate coupled to a second input of the level-shifting circuit;
a source coupled to the first node of the level-shifting circuit; and
a drain coupled to a third node of the level-shifting circuit;
a fourth transistor having:
a gate coupled to the third node of the level-shifting circuit;
a drain coupled to the second node of the level-shifting circuit; and
a source coupled to a reference high voltage of the second power domain; and
a fifth transistor having:
a gate coupled to the second node of the level-shifting circuit;
a drain coupled to the third node of the level-shifting circuit; and
a source coupled to the reference high voltage of the second power domain.

9. The method of claim 8, wherein the second transistor and the third transistor are N-type transistors, and wherein the fourth transistor and the fifth transistor are P-type transistors.

10. The method of claim 8, wherein the level-shifting circuit further comprises:
a sixth transistor coupled between the second node of the level-shifting circuit and the drain of the fourth transistor; and
a seventh transistor coupled between the third node of the level-shifting circuit and the drain of the fifth transistor.

11. The method of claim 10, wherein the sixth transistor and the seventh transistor are P-type transistors.

12. The method of claim 4, further comprising:
in response to the ESD event, turning off a second transistor coupled between the first node of the level-shifting circuit and the first transistor, wherein the second transistor is an N-type transistor, and wherein the output of the control circuit is coupled to the gate of the second transistor.

13. A method of operating a multiple power domain circuit comprising:
providing a first voltage to a first input of a level-shifter;
providing a second voltage to a second input of the level-shifter, wherein the first voltage and the second voltage are voltages in a first power domain, and the second voltage is an inverted voltage of the first voltage, wherein the level-shifter is coupled to voltage supplies in a second power domain different from the first power domain;
converting the first voltage in the first power domain to a third voltage in the second power domain using the level-shifter, wherein a first node of the level-shifter is coupled to a reference low voltage of the second power domain through a first transistor;
detecting an electrostatic discharge (ESD) event; and
upon detecting the ESD event, presenting a high impedance to the first node of the level-shifter.

14. The method of claim 13, wherein the presenting the high impedance comprises turning off the first transistor.

15. The method of claim 14, wherein the detecting comprises detecting the ESD event using a control unit, wherein an output of the control unit is coupled to a gate of the first transistor.

16. The method of claim 15, wherein upon detecting the ESD event, the control unit generates a control signal, wherein the control signal corresponds to a voltage level that turns off the first transistor.

17. The method of claim 16, wherein the level-shifter comprises:
a pair of N-type transistors each having a gate coupled to one of the first voltage and the second voltage, the pair of N-type transistors each having a source coupled to the first node of the level-shifter; and
a pair of cross-coupled P-type transistors each having a source coupled to a voltage supply of the second power domain, the pair of cross-coupled P-type transistors each having a drain coupled to the drain of one of the pair of N-type transistors.

18. A method comprising:
receiving an input signal in a first voltage range;
shifting the input signal to an output signal in a second voltage range by a level-shifter circuit, the second voltage range being different from the first voltage range;
detecting an electrostatic discharge (ESD) event by a control circuit; and
floating the level-shifter circuit in response to the detected ESD event.

19. The method of claim 18, wherein a first transistor is coupled between a first node of the level-shifter circuit and a ground level of the second voltage range, and wherein the floating comprises floating the level-shifter circuit by turning off the first transistor.

20. The method of claim 19, further comprising:
generating a control signal in the second voltage range by the control circuit in response to the detecting the ESD event; and
outputting the control signal to a gate of the first transistor to turn off the first transistor.

* * * * *